United States Patent [19]

Kakehi

[11] Patent Number: 4,664,578
[45] Date of Patent: May 12, 1987

[54] SEMICONDUCTOR SUBSTRATE TRANSPORT SYSTEM

[75] Inventor: Yutaka Kakehi, Hikari, Japan

[73] Assignee: Hitachi, Ltd., Tokyo, Japan

[21] Appl. No.: 528,660

[22] Filed: Sep. 1, 1983

[30] Foreign Application Priority Data

Sep. 17, 1982 [JP] Japan .................... 57-160979

[51] Int. Cl.$^4$ .................................... C23C 15/00
[52] U.S. Cl. ........................ 414/217; 104/134; 104/290; 198/619; 414/222
[58] Field of Search ........... 414/217, 222; 104/290, 104/293, 134; 198/619; 312/1; 318/135; 308/3 R, 6 R

[56] References Cited

U.S. PATENT DOCUMENTS

| | | | |
|---|---|---|---|
| 3,218,489 | 11/1965 | Sadler | 104/290 |
| 3,404,661 | 10/1968 | Mathias et al. | 414/217 X |
| 3,469,058 | 9/1969 | O'Connor | 308/6 R X |
| 3,777,616 | 12/1973 | Mueller | 308/6 R X |
| 3,832,610 | 8/1974 | Shimuzu et al. | 318/135 |
| 3,897,982 | 8/1975 | Teramachi | 308/6 R |
| 3,938,854 | 2/1976 | Teramachi | 308/6 R |
| 4,042,128 | 8/1977 | Shrader | 414/292 X |
| 4,264,112 | 4/1981 | Magnuson | 303/3 R |
| 4,293,249 | 10/1981 | Whelan | 414/217 X |
| 4,303,280 | 12/1981 | Geffner | 308/6 R X |
| 4,311,427 | 1/1982 | Coad et al. | 414/225 X |
| 4,463,300 | 7/1984 | Mayne et al. | 318/135 X |
| 4,465,416 | 8/1984 | Burkhalter et al. | 414/217 |

Primary Examiner—Robert J. Spar
Assistant Examiner—Stuart J. Millman
Attorney, Agent, or Firm—Antonelli, Terry & Wands

[57] ABSTRACT

A semiconductor substrate transport system includes a semiconductor substrate holder for holding semiconductor substrates to be transported, a linear pulse motor for driving and reciprocating the semiconductor substrate holder, a pulse oscillator connected to the linear pulse motor, an arrangement for holding a clearance of the linear pulse motor, and guide for guiding the reciprocating motion of the linear pulse motor. The semiconductor substrate holder, the linear pulse motor, the clearance holding arrangement and the guide are installed in a chamber which is brought into a vacuum atmosphere, whereby the appearance of dust during the transport of the semiconductor substrates can be suppressed, and the available percentage and throughput of the semiconductor substrates processed or to be processed by a semiconductor production apparatus can be enhanced.

5 Claims, 8 Drawing Figures

SEMICONDUCTOR SUBSTRATE TRANSPORT SYSTEM

BACKGROUND OF THE INVENTION

The present invention relates to a semiconductor substrate transport system, and, more particularly, to a semiconductor substrate transport system usable in semiconductor production apparatuses for subjecting semiconductor substrates to predetermined dry processing.

In semiconductor production apparatus, such as, for example, a dry etching apparatus or a plasma CVD apparatus, for subjecting semiconductor substrates to predetermined processing such as etching and formation of a film by dry processes, semiconductor substrate transport systems are used for carrying the semiconductor substrates into a processing chamber and carrying the processed semiconductor substrates out of the processing chamber. In, for example, Japanese Laid-open Patent Application No. 57-41100, a semiconductor substrate transport system of a so-called belt conveyor type is proposed wherein a belt is endlessly extended over motor driven wheels disposed in opposition to each other, and semiconductor substrates placed on the belt are transported by a conveying force resulting from rotation of the belt. In this proposed system a semiconductor substrate transport system (hereinbelow, termed "first arm conveyor system") wherein an endless chain is extended over gears disposed in opposition to each other and is shifted in both rightward and leftward directions by a reversible motor. An arm has one end thereof mounted on the endless chain and has a vacuum chuck attached to the other end thereof, and a semiconductor substrate attracted and held by the vacuum chuck is transported by the rightward and leftward movements of the arm which are based on the shifts of the endless chain in both the rightward and leftward directions. In, for example, Japanese Laid-open Patent Application No. 56-22374, a semiconductor substrate transport system (hereinbelow, termed "second arm conveyor system") is disclosed wherein a loading motor, disposed on an atmospheric side, and a mechanical chuck, disposed on a vacuum side, are coupled by an arm, while the atmospheric side and the vacuum side are shut off by an O-ring annularly mounted on the arm, and the arm is reciprocated in its longitudinal direction by the loading motor, to thereby transport a semiconductor substrate which is gripped and held by the mechanical chuck. Additionally, in, for example, Japanese Laid-open Utility Model Registration Application No. 57-33002, a semiconductor substrate transport system (hereinbelow, termed "air bearing system") is proposed wherein a semiconductor substrate is floated and transported by the thrust of jets of air.

There are a number of disadvantages in semiconductor substrate transport systems of the aforementioned types.

More particularly, in the belt conveyor system, due to a frictional force which arises between the belt and the driven wheel during the rotation of the belt dust is generated which adheres to and is deposited on the semiconductor substrate. Therefore, the available percentage of the semiconductor substrates processed by the semiconductor production apparatus is relatively low. Moreover, the quantity of dust attributed to the frictional force between the belt and the driven wheel increases with the transport rate of the semiconductor substrates, namely, with the rotational speed of the belt, and the available percentage of the processed semiconductor substrates is further reduced. Therefore, the semiconductor substrates cannot be transported at high speed, and the throughput of the semiconductor substrates to be processed by the semiconductor production apparatus is relatively low.

In the first arm conveyor system, dust also results due to a frictional force which arises between the endless chain and the gear during the turning of the endless chain. For the same reasons as in the belt conveyor system, the available percentage and throughput of the semiconductor substrates processed or to be processed by the semiconductor production apparatus is relatively low.

In the second arm conveyor system, dust also results due to a sliding force which arises between the arm and the O-ring during the transport of the semiconductor substrate, namely, during the reciprocating motion of the arm, and the dust adheres and is deposited on the semiconductor substrate. Therefore, the available percentage of the semiconductor substrates processed by the semiconductor production apparatus is relatively low. With an increase in the transport rate of the semiconductor substrates or the reciprocating speed of the arm, the quantity of the dust attributed to the sliding force between the arm and the O-ring increases more thereby further reducing the available percentage of the processed semiconductor substrates, and the sliding force deteriorates the effectiveness of the O-ring more to shut off the atmospheric side and the vacuum side. Therefore, the semiconductor substrate cannot be transported at high speed, and the throughput of the semiconductor substrates to be processed by the semiconductor production apparatus is relatively low. With the loading motor and mechanical chuck installed on the vacuum side, the O-ring for shutting off the atmospheric side and the vacuum side is unnecessary, and hence, it is possible to avoid the dust ascribable thereto. However, dust appears anew from the sliding part and turning part of the loading motor. Accordingly, the aforementioned disadvantages cannot be eliminated even when the loading motor and mechanical chuck is disposed on the vacuum side.

A disadvantage of the air bearing system resides in the fact that such system cannot be used in a vacuum atmosphere. Moreover, it is necessary for the air for the air bearing system to be extraordinarily clean so as to increase the percentage of processed semiconductor substrates as well as the throughput of the semiconductor substrates processed or to be processed by the semiconductor production apparatus.

An object of the present invention is to provide a semiconductor substrate transport system wherein a linear pulse motor, which is a noncontacting driving device having neither a sliding part, nor a turning part is employed for reciprocatingly driving a semiconductor substrate holder means in a vacuum atmosphere, with the linear pulse motor being disposed in the vacuum atmosphere, thereby suppressing a generation of dust during the transport of semiconductor substrates, namely, during the reciprocating drive of the semiconductor substrate holder means, and to enhance the available percentage and throughput of the semiconductor substrates processed or to be processed by a semiconductor production apparatus.

In accordance with the present invention, a semiconductor substrate transport system is provided which includes a semiconductor substrate holder means for holding semiconductor substrates to be transported, a linear pulse motor for reciprocatingly driving the semiconductor substrate holder means, a pulse oscillator connected to the linear pulse motor, clearance holding means for holding a clearance of the linear pulse motor, and guide means for guiding the reciprocating motion of the linear pulse motor and the semiconductor substrate holding means. The linear pulse motor, the clearance holding means and the guide means are installed within a chamber which is brought into a vacuum atmosphere, whereby the semiconductor substrate holding means is reciprocatingly driven by the linear pulse motor, to suppress the generation of dust during the transport of the semiconductor substrates, namely, during the reciprocating movement of the semiconductor substrate holding means.

DETAILED DESCRIPTION

Figure 1:
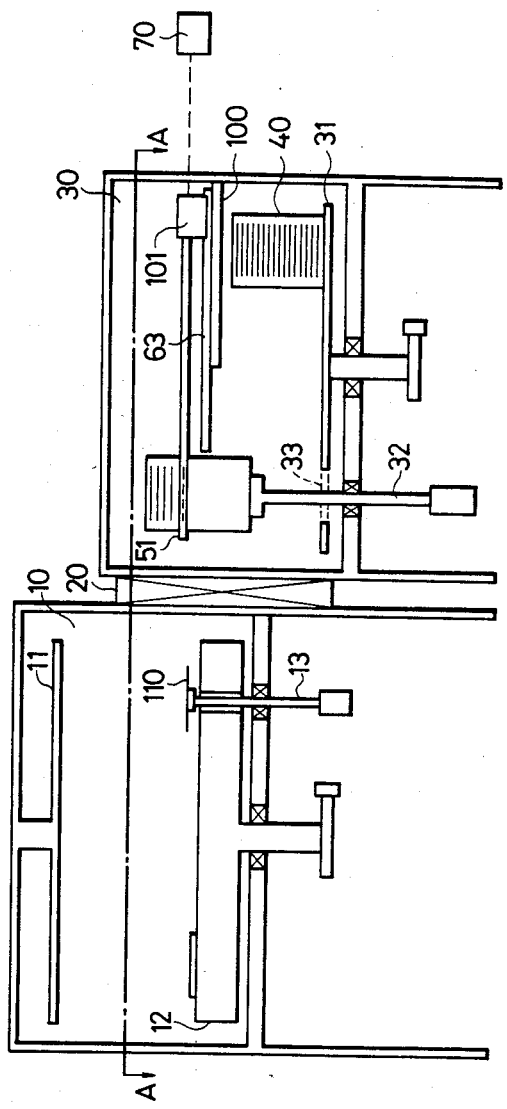
FIG. 1 is a partially schematic vertical view of a dry etching apparatus to which a semiconductor substrate transport system of the present invention is applied.
Figure 2:
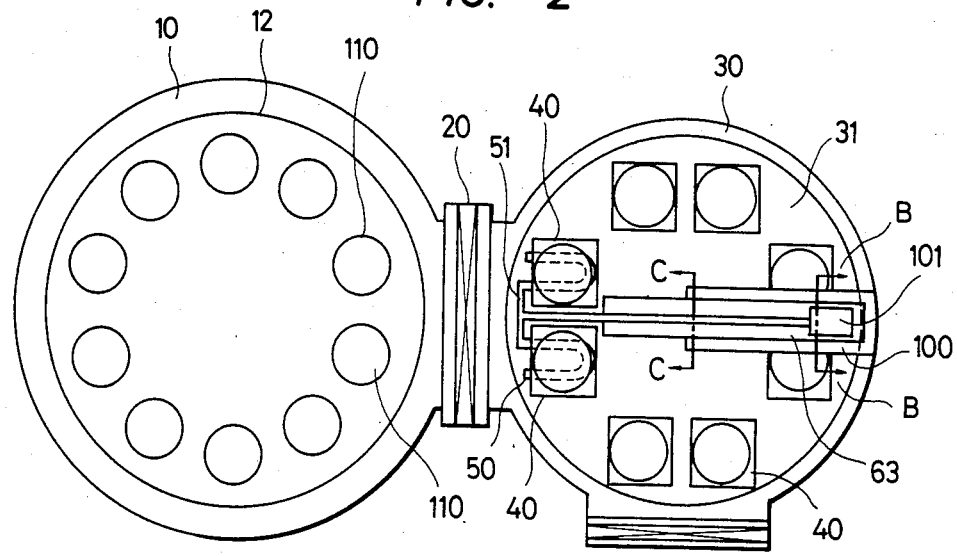
FIG. 2 is a cross sectional view taken along the line A—A in FIG. 1.
Figure 3:
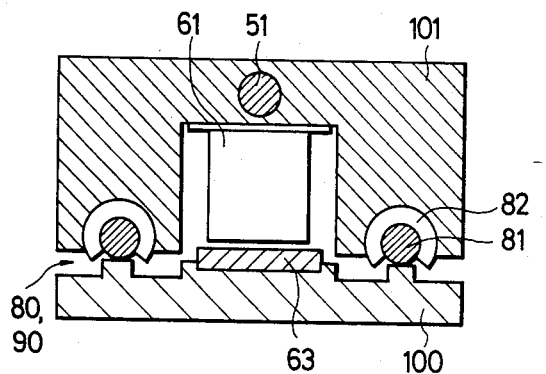
FIG. 3 is a cross-sectional view taken along the line B—B in FIG. 2.
Figure 4:
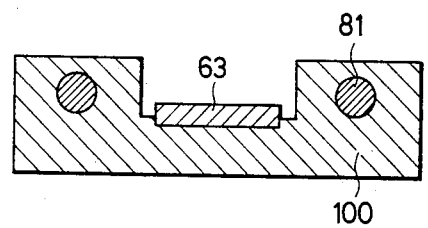
FIG. 4 is a cross sectional view taken along the line C—C in FIG. 2.
Figure 5:
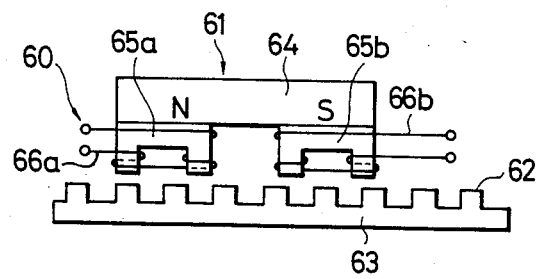
FIG. 5 is a schematic view of a linear pulse motor.

Referring now to the drawings wherein like reference numerals are used throughout the various views to designate like parts and, more particularly, to FIG. 1, according to this figure, a dry etching apparatus such as, for example, a semiconductor production apparatus includes a processing chamber 10, in which an electrode 11 is fixedly disposed at, for example, an upper position thereof, and an electrode 12 for placing semiconductor substrates 110 thereon (hereinbelow, simply termed "table") is rotatably disposed below the electrode 11 in vertical opposition to the electrode 11. For example, an opening and closing means such as one gate valve 20 is mounted on the side wall of the processing chamber 10 in communication with the interior of the processing chamber 10. A semiconductor substrate elevator 13 receives the semiconductor substrate carried into the processing chamber 10 and places the semiconductor substrate on the semiconductor substrate setting position of the table 12. The elevator 13 also floats the semiconductor substrate above the table 12 and separates the same from the table 12 in order to carry it out of the processing chamber 10. In this case, two such elevators 13 are disposed at the bottom wall of the processing chamber 10 at positions corresponding to the semiconductor substrate setting positions of the table 12 and which adjoin the gate valve 20. Vacuum pump means (not shown) is connected to the processing chamber 10.

The electrode 11 is formed with gas emission apertures (not shown) for emitting a processing gas toward the surface of the table 12, and gas feed passages (not shown) are provided for feeding the processing gas to the gas emission apertures. The gas feed passages have a gas feed pipe (not shown) connected thereto, which, in turn, is connected to gas feed means (not shown) installed outside the processing chamber 10. A power supply such as, for example, a radio frequency power supply (not shown), is connected to the table 12 in a state in which it does not hinder the turning of the table 12.

In this case, a preliminary chamber 30 is attached to the processing chamber 10 through the gate valve 20. At a lower position of the preliminary chamber 30, a cassette moving means, for example, a cassette placing table 31 (hereinbelow, termed "cassette table") is rotatably disposed, with the cassette table 31 being adapted to place a plurality of cassettes 40 therein, which, in the illustrated embodiment, is eight. The bottom wall of the preliminary chamber 30 is provided with two cassette elevators 32 at positions corresponding to the semiconductor substrate elevators 13. The cassette table 31 is provided, at positions corresponding to the cassette elevators 32, with openings 33 through which the cassette elevtors 32 can be inserted. The preliminary chamber 30 is furnished with vacuum pump means (not shown), and is provided with an entrance and exit (not shown) for the cassettes.

The semiconductor substrate transport system includes semiconductor substrate holder means of, for example, semiconductor substrate cradles 50 (hereinbelow, simply termed "cradles") for holding the semiconductor substrates to be transported, a linear pulse motor 60 for reciprocatingly driving the cradles 50 in a non-contacting manner, a pulse oscillator 70 connected to the linear pulse motor 60, clearance holding means 80 for holding the clearance of the linear pulse motor 60, and guide means 90 for guiding the reciprocating motion of the linear pulse motor 60. The linear pulse motor 60 includes a pulse motor 61, and a scale 63 having a surface provided with regularly spaced comb teeth 62 arranged in the longitudinal direction therof. The pulse motor 61 includes a permanent magnet 64, and electromagnets 65a, 65b. The clearance holding means 80 and the guide means 90 includes stationary shafts 81 and open type linear bearings 82. The open type linear bearing 82 includes an outer cylinder and a ball retainer forming a cylindrical type linear bearing (not shown) which are axially removed in one row, and it has a structure adapted to be used when the stationary shaft 81 is supported by struts or a pedestal in order to avoid the flexure thereof. Since the contact between the stationary shaft 81 and rolling balls retained by the ball retainer is a point contact, the coefficient of dynamic friction is small, so the generation of dust is relatively small. Furthermore, the use of a lubricant is avoided. The semiconductor substrate transport system constructed as thus far described is attached to the preliminary chamber 30 in a manner described more fully hereinbelow.

A fixture 100 is supported on the inner side wall of the preliminary chamber 30 at a position which corresponds to the semiconductor substrate elevators 13 and cassette elevators 32 and which confronts the cassette elevators 32. In this case, the spacing between the rear surface of the fixture 100 and the front surface of the cassette table 31 is greater than the height of the cassette 40. The scale 63 is mounted on the front surface of the fixture 100 so as to extend in a longitudinal direction of the fixture 100 toward the cassette elevators 32, namely, the direction of transporting the semiconductor substrates, and in which its surface formed with the comb teeth 62 is a horizontal plane. On the front surface of the fixture 100, the stationary shafts 81 are juxtaposed to the scale 63 on both the sides thereof. The pulse motor 61 is unitarily attached to a fixture 101 with the open type linear bearings 82 disposed at positions corresponding to the stationary shafts 81. The pulse motor 61 is arranged over the scale 63 so that the open type linear bearings 82 are movably fitted on the stationary shafts 81. A clearance of the linear pulse motor 60, namely, the clearance between the electromagnets 65a, 65b and the comb teeth 62 is maintained by the stationary shafts 81 and the open type linear bearings 82. The fixture 101 is provided with an arm 51 extending in the semiconductor substrate transporting direction, and the end of the arm 51 remote from the fixture 100 is provided with the two cradles 50 at positions corresponding to the semiconductor substrate elevators 13 and the cassette elevators 32. The respective electromagnets 65a, 65b have coils 66a, 66b, to which the pulse oscillator 70, disposed outside the preliminary chamber 30, is connected.

The pressure in the processing chamber 10 is reduced to a predetermined value with the gate valve 20 closed, with the preliminary chamber 30 being open to the atmosphere. The cassettes 40, loaded with the semiconductor substrates 110 and numbering eight in this case, are introduced, either manually or by known conveyance means into the preliminary chamber 30 through the cassette entrance/exit. Thereafter, the cassettes 40 are placed on the cassette table 31 so as to be movable transversely to the reciprocating axis of the arm 51, in this case, so that the cassettes may be located at angular intervals of 90°, with two cassettes forming a set, aligning with the cassette elevators 32 when the cassette table 31 turns by the angle of 90°. The cassette elevators 32 are positioned so as not interfere with the turning of the cassette table 31. When the cassettes 40 have been carried into the preliminary chamber 30 and placed on the cassette table 31, the preliminary chamber 30 is shut off from outside, and its internal pressure is reduced down to a value approximately equal to the pressure of the processing chamber 10. Thereafter, the gate valve 20 is opened to bring the processing chamber 10 and the preliminary chamber 30 into communication. Subsequently, the cassette table 31 is turned until one set of cassettes 40 is brought into alignment with the cassette elevators 32. When one set of cassettes 40 is brought into alignment with the cassette elevators 32, the cassette table 31 is stopped. Meantime, the cradles 50 are held withdrawn so as not to interfere with the movement of the cassettes 40. Thereafter, the cassettes 40 are raised or elevated by the cassette elevators 32 so that the semiconductor substrates 110 may successively be removed from the semiconductor substrates 110 packed in the lowermost portions of the cassettes 40. After the raising or elevating of the cassettes 40, the cradles 50 are moved up under the semiconductor substrates 110 packed in the lowermost portions of the cassettes 40, by impressing pulses from the pulse oscillator 70 on, for example, the electromagnet 65a of the pulse motor 61 and in accordance with the number of the pulses. When the cradles 50 have been moved up under the lowest semiconductor substrates 110, the impression of pulses on the electromagnet 65a is interrupted resulting in a stopping of the cradles 50. Thereafter, the cassettes 40 are lowered by one pitch by the cassette elevators 32, whereby the lowest semiconductor substrates 110 are placed on and received by the cradles 50. The cradles 50 receiving the semiconductor substrates 110 are shifted from the preliminary chamber 30 into the processing chamber 10 through the gate valve 20 by impressing pulses from the pulse oscillator 70 on the electromagnet 65a and in accordance with the number of the pulses. When the cradles 50 have arrived at positions corresponding to the wafer elevators 13, the impression of the pulses on the electromagnet 65a is interrupted thereby stopping a movement of the cradles 50. The wafer elevators 13 are thereafter raised, whereby the semiconductor wafers 110 are delivered from the cradles 50 to the wafer elevators 13, with the cradles 50 being moved from the processing chamber 10 into the preliminary chamber 30 through the gate valve 20 by impressing pulses from the pulse oscillator 70 on the electromagnet 65b and in accordance with the number of the pulses. Thereafter, the impression of the pulses on the electromagnet 65b is interrupted, so that the cradles 50 are stopped under the semiconductor substrates 110 to be subsequently taken out of the cassettes 40. On the other hand, the semiconductor substrate elevators 13, accommodating the lowest semiconductor substrates 110, are lowered, whereby the two semiconductor substrates 110 are delivered from the semiconductor substrate elevators 13 to the table 12 and are simultaneously placed on the semiconductor substrate setting positions of the latter. After the semiconductor substrate elevators 13 have been lowered to positions where they do not interfere with the turning of the table 12, the table 12 is turned so that the next setting positions for the semiconductor substrates are aligned with the semiconductor substrate elevators 13.

By repeating such operations in succession, in this case, five times, the semiconductor substrates 110 packed in the cassettes 40 are taken out in pairs and carried from the preliminary chamber 30 into the processing chamber 10 through the gate valve 20, whereupon ten semiconductor substrates 110 are placed on the semiconductor substrate setting positions of the table 12 in pairs.

After the semiconductor substrates 110 have been placed on the table 12, the gate valve 20 is closed to cut off the communication between the processing chamber 10 and the preliminary chamber 30. Thereafter, the processing gas is supplied from the gas feed means to the gas feed passages through the gas feed pipe, and the gas having flowed through the gas feed passages is emitted toward the surface of the table 12 through the gas emission apertures. On the other hand, radio-frequency power is applied from the radio-frequency power supply to the table 12 so as to cause an electric discharge between the electrode 11 and the table 12, whereby the processing gas is turned into a plasma. In this case, the semiconductor substrates 110, placed on the table 12, are etched by the plasma. Meantime, the table 12 is rotated at a predetermined rotating speed. The semiconductor substrates 110, subjected to such processing, are carried out of the processing chamber 10 into the preliminary chamber 30 through the gate valve 20 in pairs by operations reverse to the foregoing operations, whereupon they are restored into the cassettes 40 in pairs. After the processing and restoration of the semiconductor substrates 110, packed in the cassettes 40 has been completed, the cassette table 31 is turned by the angle of 90° so that another of the sets of cassettes 40, placed on the cassette table 31 at the angular intervals of 90°, may be aligned with the cassette elevators 32. Subsequently, the semiconductor substrates 110, packed in the cassettes 40, are taken out of the cassettes 40 in pairs and then processed in the processing chamber 10, whereupon the processed semiconductor substrates 110 are returned to the cassettes 40 in pairs. After the semiconductor substrates 110, packed in all the cassettes 40, have been processed and returned in this way, the preliminary chamber 30 is opened to the atmosphere, and all the cassettes 40 are manually or automatically transported out of the preliminary chamber 30. At the next stage, eight new cassettes 40, loaded with new semiconductor substrates 110, are carried into the preliminary chamber 30 from outside, the sets, each consisting of two of the cassettes 40, are placed on the cassette table 31 at the angular intervals of 90° similarly to the foregoing, and the above-described operations are carried out.

During the drive for reciprocating the cradles 50, that is, during the reciprocating motion of the pulse motor 61, attraction forces, nearly equal to thrust force, act between the electromagnets 65a, 65b and the scale 63. However, the clearances between the electromagnets 65a, 65b and the comb teeth 62 are maintained by the stationary shafts 81 and the open type linear bearings 82. Additionally, the reciprocating motion of the pulse motor 61 is favorably guided by the stationary shafts 81 and the open type linear bearings 82.

By virtue of the present invention, the cradles can be driven and reciprocated by the liner pulse motor which has neither a sliding part not a turning part, and the reciprocating motion of the linear pulse motor is guided by the open type linear bearings which develop very little dust. Therefore, the appearance of dust during the transport of semiconductor substrates, namely, during the drive for reciprocating the cradles can be suppressed, and the available percentage and throughput of the semiconductor substrates etched or to be etched by the dry etching apparatus can be enhanced.

Moreover, with the present invention, since linear pulse motor does not generate dust, even when installed in the preliminary chamber which is brought into a vacuum atmosphere, it does not adversely affect the available percentage and throughput of semiconductor substrates etched or to be etched by the dry etching apparatus.

Furthermore, with the linear pulse motor and the open type linear bearings as proposed by the present invention, no problem arise as to installation and and operations in the preliminary chamber which is brought into a vacuum atmosphere, and the linear pulse motor and linear bearings can be favorably used, in the vacuum atmosphere.

Additionally, since the cradles can be driven and reciprocated by the linear pulse motor, the reciprocating motion of the cradles, namely, the transport of semiconductor substrates, can be performed at high precision.

Figure 6:
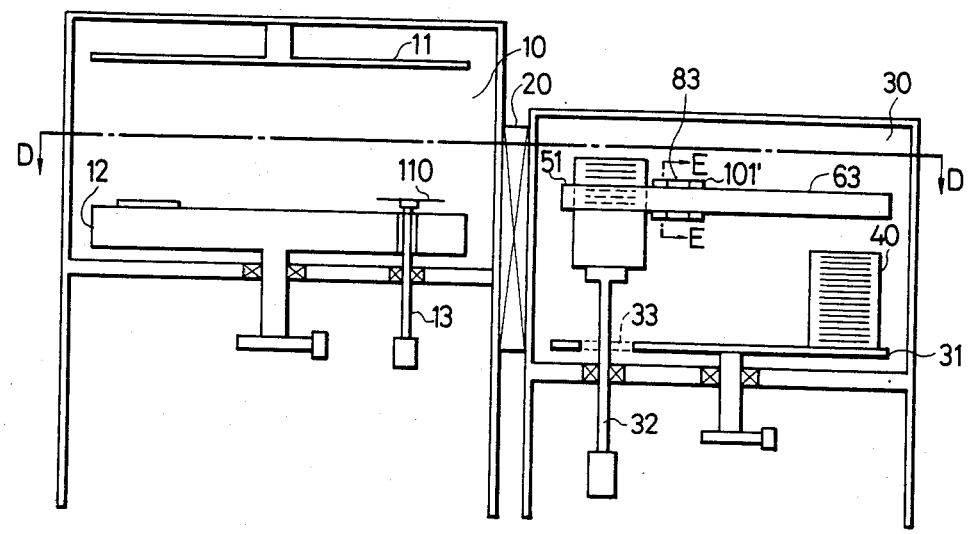
FIG. 6 is a vertical partially schematic view of a dry etching apparatus to which another embodiment of a semiconductor substrate transport system according to the present invention is applied.
Figure 8:
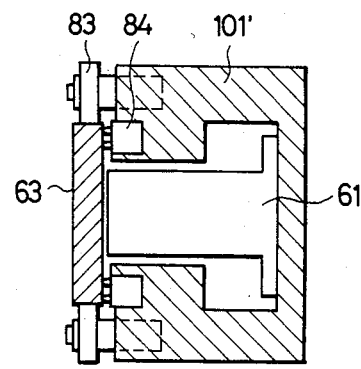
FIG. 8 is a cross-sectional view taken along the line E—E in FIG. 6.

Referring to FIGS. 6 and 8, a fixture 100′ is supported on the inner side wall of the preliminary chamber 30, and in this case, it is extended orthogonally to the direction of transporting semiconductor substrates. A fixture 101′ is attached to the fixture 100′, and the pulse motor 61 is mounted on the fixture 101′ in such a manner that the surfaces of the permanent magnet 64 and the electromagnets 65a, 65b are vertical planes and that the pulse motor corresponds to the semiconductor substrate elevators 13 and cassette elevators 32. On the other hand, the scale 63 is disposed so as to be movable in the transporting direction of the semiconductor substrates, in such a manner that the comb teeth 62 confront the permanent magnet 64 and the electromagnets 65a, 65b, and that both the sides of the scale are held by ball-and-roller bearings 83 installed on the fixture 101′. In this case, the clearance of the linear pulse motor 60, namely, the clearances between the electromagnets 65a, 65b and the comb teeth 62 are held proper by straight type linear bearings 84 which are installed in the fixture 101′ in opposition to the comb teeth 62. Here, the straight type linear bearing 84 is such that the rotary type linear bearing (not shown) described above is planar. The cradles 50 are attached to the scale 63 through the arms 51. In this case, the cradles 50 are driven and reciprocated through the scale 63 which is driven and reciprocated by the pulse motor 61, and the reciprocating motion of the scale 63 is favorably guided by the ball-and-roller bearings 83.

Figure 7:
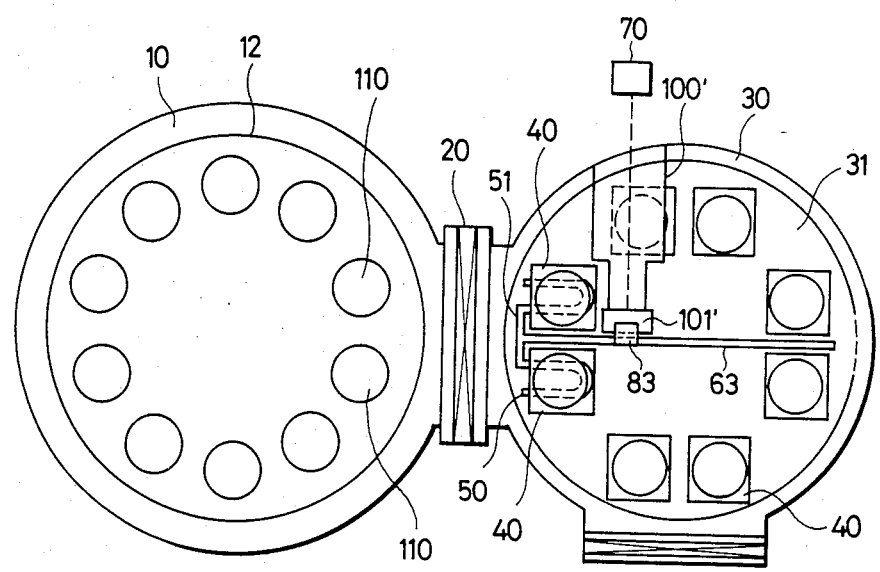
FIG. 7 is a cross-sectional view taken along the line D—D in FIG. 6.

Since, in the embodiment of FIGS. 6–8, the pulse motor is fixed, the connection between this pulse motor and the pulse oscillator can be simplified.

Moreover, with the pulse motor being fixed, the scale is movable, and the cradles are attached to the scale. Therefore, the movable parts can be made still lighter in weight, and the transport speed for semiconductor substrates can be enhanced.

Furthermore, the scale is so disposed that the comb teeth are vertical. Therefore, the intervals of the cassettes which are placed on the cassette table with two of them forming one set can be small, and the capacity of the preliminary chamber can be small.

While, in the foregoing embodiments, the dry etching apparatus has been referred to as the semiconductor production apparatus, the semiconductor substrate transport system of the present invention is also applicable to other semiconductor production apparatus including plasma CVD apparatus without any problem. The semiconductor substrate holding means may well be a chucking device such as a mechanical chuck or vacuum chuck. Even when the processing chamber is furnished with a plurality of preliminary chambers, no special hindrance is involved in the application of the present invention. How to attach the cradles to the arm, and the number and shape of these cradles are not especially restricted to those in the foregoing embodiments. The cassette moving means may well be a device which moves a plurality of cassettes rectilinearly transversely to the direction of transporting semiconductor substrates.

As set forth above, the present invention consists in that a semiconductor substrate transport system is constructed of semiconductor substrate holder means for holding semiconductor substrates to be transported, a linear pulse motor which drives and reciprocates said semiconductor substrate holder means, a pulse oscillator which is connected to said linear pulse motor, clearance holding means for holding a clearance of said linear pulse motor, and guide means for guiding the reciprocating motion of said linear pulse motor, and that said semiconductor substrate holder means, said linear pulse motor, said clearance holding means and said guide means are installed in a chamber which is brought into a vacuum atmosphere. The invention therefore has the effects that the appearance of dust during the transport of the semiconductor substrates can be suppressed and that the available percentage and throughput of the semiconductor substrates processed or to be processed by a semiconductor production apparatus can be enhanced.

What is claimed is:

1. A semiconductor substrate transport system comprising: semiconductor substrate holding means for holding semiconductor substrates to be transported; a linear pulse motor for reciprocatingly driving said semiconductor substrate holder means, said linear pulse motor including a permanent magnet, electromagnets, and a scale having a surface corresponding to said electromagnets, said scale being formed with comb teeth spaced at regular intervals;

a pulse oscillator means for impressing pulses on said electromagnets a required transporting momentum for said semiconductor substrate holder means;

clearance holding means for holding a clearance between the electromagnets and the scale; and guide means for guiding the reciprocating motion of said semiconductor substrate holding means by said linear pulse motor to transport through vacuum opening and closing means semiconductor substrates retained by said semiconductor substrate holder means between a table provided in a processing chamber adapted to be evacuated so as to create a vacuum atmosphere and a cassette in a preliminary chamber communicable with said processing chamber through said vacuum opening and closing means.

2. A semiconductor substrate transport system according to claim 1, wherein said clearance holding means and said guide means include stationary shafts and open type linear bearings movably fitted on said shafts.

3. A semiconductor substrate transport system according to claim 2, wherein said scale is fixedly mounted in the preliminary chamber in a direction of reciprocating motion of said semiconductor substrate holder means, said stationary shafts are disposed on both sides of said scale, said pulse motor and said open type linear bearings are unitarily disposed in said preliminary chamber, said comb teeth in said scale being disposed in opposition to said electromagnets of said pulse motor, and wherein said open type linear bearings are movably fitted on said stationary shafts in such a manner that clearances are maintained between said comb teeth and said electromagnets.

4. A semiconductor substrate transport system according to claim 1, wherein said clearance holding means includes straight linear type bearings and said guide means are constructed as guide bearings.

5. A semiconductor substrate transport system according to claim 4, wherein said scale is movably installed in said preliminary chamber in a direction of reciprocating motion of said semiconductor substrate holer means, said pulse motor, said straight type linear bearings, and said guide bearings are unitarily disposed in said preliminary chamber, said comb teeth in said scale are disposed in opposition to said electromagnets of said pulse motor, and both side surfaces of said scale are held by said guide bearings in such a manner that clearances between said comb teeth and said electromagnets are maintained by said straight type linear bearings.

* * * * *